United States Patent

Kopp et al.

[11] Patent Number: 5,809,464
[45] Date of Patent: *Sep. 15, 1998

[54] APPARATUS FOR RECORDING SPEECH FOR SUBSEQUENT TEXT GENERATION

[75] Inventors: Dieter Kopp, Hemmingen; Heidi Hackbarth, Korntal, both of Germany

[73] Assignee: Alcatel N.V., Riijswijk, Netherlands

[*] Notice: This patent issued on a continued prosecution application filed under 37 CFR 1.53(d), and is subject to the twenty year patent term provisions of 35 U.S.C. 154(a)(2).

[21] Appl. No.: 532,115

[22] Filed: Sep. 22, 1995

[30] Foreign Application Priority Data

Sep. 24, 1994 [DE] Germany .................. 44 34 255.1

[51] Int. Cl.$^6$ ...................................... G10L 3/00
[52] U.S. Cl. .......................... 704/235; 704/200
[58] Field of Search .................. 395/2.44, 2.79, 395/2.84, 2.09, 2.6, 2.42, 2.52, 2.67; 704/235, 200, 270, 272

[56] References Cited

U.S. PATENT DOCUMENTS

| | | | |
|---|---|---|---|
| 4,415,767 | 11/1983 | Gill et al. | 395/2.52 |
| 4,461,023 | 7/1984 | Katayama | 395/2.61 |
| 4,477,925 | 10/1984 | Avery et al. | 395/2.46 |
| 5,016,279 | 5/1991 | Kawama et al. | 395/2.39 |
| 5,031,113 | 7/1991 | Hollerbauer | 395/2.44 |
| 5,051,924 | 9/1991 | Bergeron et al. | 364/513.5 |
| 5,179,627 | 1/1993 | Sweet et al. | 395/2.09 |
| 5,231,670 | 7/1993 | Goldhor et al. | 395/2.84 |
| 5,251,261 | 10/1993 | Meyer et al. | 395/2.2 |
| 5,491,774 | 2/1996 | Norris et al. | 395/2.79 |
| 5,526,407 | 6/1996 | Russell et al. | 379/89 |

FOREIGN PATENT DOCUMENTS

| | | | |
|---|---|---|---|
| 0 092 084 | 10/1983 | European Pat. Off. | H04M 1/15 |
| 0 294 202 | 12/1988 | European Pat. Off. | G09B 5/04 |
| 0 299 711 | 1/1989 | European Pat. Off. | H03M 7/30 |
| 0 337 086 | 10/1989 | European Pat. Off. | G06F 3/16 |
| 2 639 741 | 6/1990 | France | G06K 19/00 |
| 2 692 710 | 12/1993 | France | G11B 5/02 |
| 32 32 398 | 8/1982 | Germany | G11C 27/00 |
| 41 01 200 | 7/1992 | Germany | G10L 5/04 |
| 42 07 447 | 9/1993 | Germany | G10L 5/04 |

OTHER PUBLICATIONS

"Dictaphone", Corporate Brochure, Undated—(but known to inventor before Sep. 24, 1994); The Voice of Business, 2 pgs. Taschengerate and Burogerate Pocket Sized Device. No date.

National Semiconductor, Preliminary Mar. 1994 "NM29N16 16 MBIT (2MX8BIT)CMOS NAND Flash E$^2$PROM"TL/D/11915–1, pp. 1–25.

*Primary Examiner*—Richemond Dorvil
*Attorney, Agent, or Firm*—Frishauf, Holtz, Goodman, Langer & Chick

[57] ABSTRACT

An apparatus for recording speech for subsequent generation of a text includes an acoustic input (M) and an acoustic output (L) for inputting and outputting analog speech respectively. An analog-to-digital/digital-to-analog (AD/DA) converter converts the inputted analog speech into a digitized speech and converts digitized speech into analog speech. A preprocessor (VV) preprocesses the digitized speech converted by the converter (AD/DA), and extracts spectral component characteristics from the digitized speech. A digital memory (MEM) stores the digitized preprocessed speech and a controller (CON) controls an execution of inputted operating functions by at least one of the preprocessor and the digital memory. The method of recording speech for subsequent generation of a text using a speech-processing system includes digitizing an input analog speech data, preprocessing the digitized analog speech data by extracting spectral component characteristics from the digitized analog speech for subsequent generation of a text by a speech recognition process, storing the digitized preprocessed speech in a digital memory, and subsequently retrieving the digitized preprocessed analog speech from the digital memory and converting the retrieved speech into a text by use of a speech-processing system that includes a speech recognition program.

10 Claims, 3 Drawing Sheets

APPARATUS FOR RECORDING SPEECH FOR SUBSEQUENT TEXT GENERATION

BACKGROUND OF THE INVENTION

1. Field of the Invention

The invention relates to an apparatus and a method for recording speech for subsequent generation of a text.

2. Description of the Prior Art

From the prior art, dictating machines are known that use audio cassettes, which use so-called minicassettes and microcassettes, as a storage medium. These dictating machines have known control functions such as "record", "fast-forward", "rewind" and "playback", which are used for later generation of a text and for correction during recording (see the Diktaphone corporate brochure entitled "*Taschengeräte*" [Pocket-sized Devices]; The Voice of Business), the entire contents of which are incorporated herein by reference.

In the prior art, so-called telecooperation services and added value services are also known. These terms are to be understood to mean that various customers A, B, C use a voice line to telephone a service business and dictate a message; from this dictated message, the service business generates a text, and it returns the finished text to the customer, by E-mail, for instance. The service business can either use its own secretarial staff for transcription, or can employ part-time home-based workers, for instance. The text is manually input on [written by] and stored in text-processing personal computers. For billing purposes, special "transcription service fee units", for instance, can be charged for the service, as described in Philips Dictation Systems, "*Schreibdienste über Telefon*" [Transcription Services by Phone], January 1994), the entire contents of which are incorporated herein by reference.

With the progressive improvement in modern speech recognition systems, speech systems have come into existence that make it possible to provide automatic text output in response to speech input. The text is input in spoken form by a user, whereupon an acoustical analysis of the speech is made. After the acoustical analysis is completed, the speech is fed to a comparator system that compares the speech with a phoneme list stored in a lexicon. From the comparison, a recognized word sequence is then found. The words thus recognized are converted directly into a text. In this prior art speech recognition system operation, virtually every possible difficulty that can occur will arise. It must also again be noted that this prior art system is unsuitable for processing speech provided from minicassettes and microcassettes, since the audio quality of microcassettes and minicassettes does not meet the demands of a speech recognition system such as that described in "Philips Research Topex", *Spracheingabe- Textausgabe der heutige Stand der Spracherkennung* [Speech Input/Text Output in the Current State of Speech Recognition], No. 3, September 1993), the entire contents of which are incorporated herein by reference.

All the above known systems have other disadvantages, such as their relative bulk if they use standard sized (not minicassettes or microcassettes) cassettes, or poor flexibility in terms of the time and place of use of the dictation system, or the nonusability of minicassettes and microcassettes for known speech recognition systems.

SUMMARY OF THE INVENTION

It is accordingly an object of the present invention to provide a recording apparatus and a recording method that operate digitally and can be used universally.

An important feature of the method and apparatus of the present invention is that a chronological and spatial separation is assured between recording with preprocessing, on the one hand, and comparison for text generation, on the other hand. The preprocessing assures that an optimally preprocessed speech for recognition is available to a speech processing system.

Another feature of the present invention is that a digital dictation machine using the apparatus of the present invention can be very compact and small. The use of a digital memory in the present invention instead of audio cassettes to record and store the speech input, eliminates a need for a large tape drive that is required for such audio cassettes.

Another feature of the present invention is that data reduction is provided by means of an additional encoding which provides extracted speech and data characteristics. This is advantageous for storage purposes, because less storage space is needed, and the apparatus thus can be smaller and less expensive.

The invention will be described in further detail below in conjunction with the drawings.

DRAWINGS

DETAILED DESCRIPTION

Figure 1:
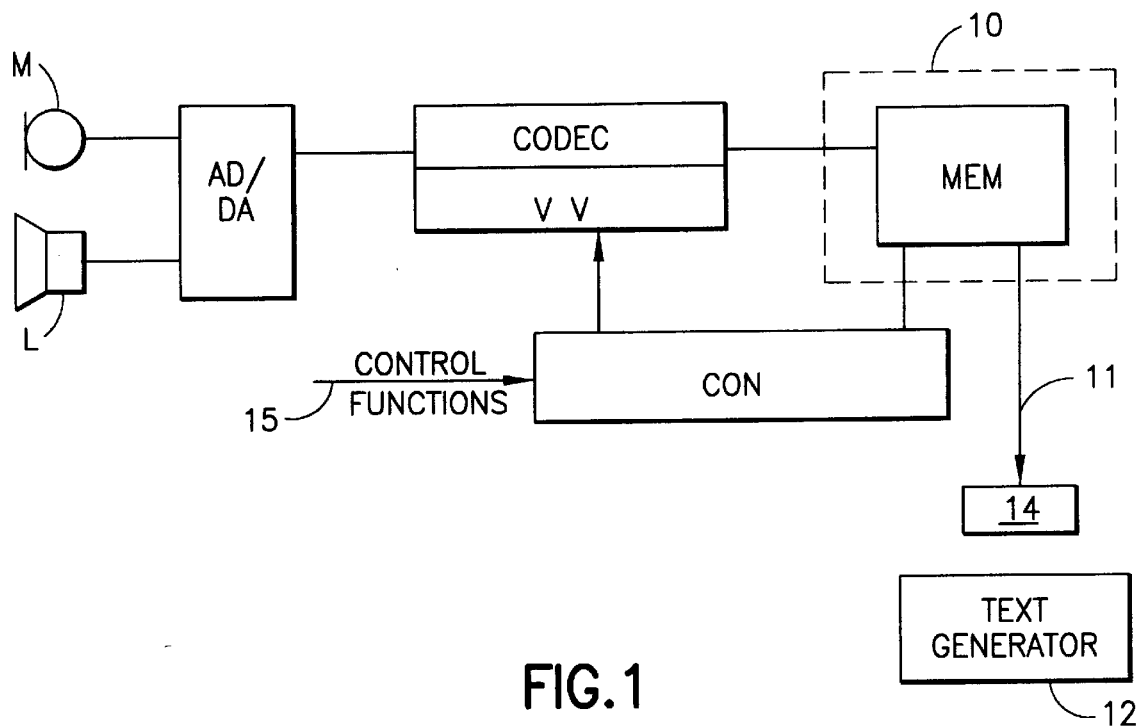
FIG. 1 is a block diagram of an apparatus according to the invention for recording speech.

The apparatus of the invention, as shown in FIG. 1, comprises an acoustical input means M, for example a microphone. Analog speech is inputted to the apparatus via the microphone. The inputted analog speech is then fed to an analog-to-digital/digital-to-analog converter AD/DA (which is known in the art), in which the analog speech is digitized. Thereafter the digitized speech is fed to preprocessing means VV via a coder/decoder CODEC. Preprocessing in VV of the digitized speech is provided in the form of feature extraction.

One of a plurality of features of the inputted speech may be extracted with a feature extraction method. Using extracted spectral components, the characteristics of the speech are stored and speech may be reproduced from the stored speech subsequently. Feature extraction provided by the preprocessing means VV uses software to extract spectral component characteristics from the digitized speech. "Feature Extraction" is well known in the art, for example, see SAMBUR, M.: "*Selection of Acoustic Features For Speaker Identification*", IEEE transactions on ASSP (1975) 23. S. 176ff, the entire contents of which are incorporated herein by reference. For instance, in the present invention, spectral component characteristics are extracted from the digitized speech by the preprocessing means VV. The extracted spectral component characteristics are then stored in a digital memory MEM. The dashed lines 10 around memory MEM indicate that memory MEM is removable and can be replaced by another memory MEM. When the memory MEM is removed it can be transferred to a text generator 12 located at a distant location under the control of the controller CON via a data link 11 and a communication network 14 which can be one of a radio network 16 and a telecommunication network 17 (See FIG. 5a and 5b).

The speech recording apparatus of the present invention of FIG. 1, as noted above, also comprises the controller CON. Control functions are inputted into the controller CON via lead 15. These control functions may, for instance, include fast-forward and rewind, playback, or a record function. The controller CON, depending on the special control function input thereto via lead 15, acts upon either the preprocessing means VV or the memory MEM.

For playback of already recorded speech, the already digitized preprocessed stored speech is retrieved from the memory MEM each time it is needed, for instance under control of the controller CON, and the retrieved data is supplied to the preprocessing means VV, and then converted into analog form via the analog-to-digital/digital-to-analog converter AD/DA, and played back via the acoustical output means (L), for example a speaker.

The speech recording apparatus of FIG. 1, as noted above, also has a coder-decoder CODEC. In the coder-decoder CODEC, either the previously digitized speech is encoded and then stored in the memory MEM, or the digitized speech is decoded for playback of the already stored speech. The speech decoded in this way is converted back into analog form via the analog-to-digital/digital-to-analog converter AD/DA and outputted via the speaker L. A data reduction is thus accomplished by means of this encoding.

Selectively, a non-volatile EEPROM or a PCMCIA card (i.e. a Personal Computer Memory Card International Association) can be used as the digital memory MEM. The PCMCIA card is a standardized memory card that is usable in a standardized format. The PCMCIA standard was created by more than 40 companies (including U. S. companies) and a person skilled in the art would know what a PCMCIA card represents and how it functions.

The present invention uses a 16 Mbit or 32 Mbit Nand EEprom which is sold by Toshiba, part number TC5816 or a part sold by National Semiconductor, part number NM29N16, can function as a non-volatile memory MEM that can operate as a random access memory. The Preliminary Data Sheets dated March, 1994, entitled "NM29N16 16 MBit (2M×8 Bit) CMOS NAND FLASH $E^2PROM$", Part No. NM29N16 (first data sheet also identified as TL/D11915-1), the entire contents of all the Preliminary Data Sheets are incorporated herein by reference. In this regard it should be noted that page 1 of the data sheets for National Semiconductor part number NM29N16 left hand column, four lines from the bottom, refers to the PCMCIA cards and treats these PCMCIA cards as well known in the art which anyone using the specification sheets would understand. The PCMCIA card is removable and can be carried around from place to place as a storage means for the speech previously spoken and stored therein. If an EEPROM is used instead of a PCMCIA card and functions as a nonvolatile memory; the EEPROM will be permanently installed in the apparatus. A transfer of speech data stored in the EEPROM can be accomplished by means of a data transfer via data link 11, for instance over communication network 14 to a data processing terminal unit or text generator 12. Another option available here is a data transfer over data link 11 to a GSM network (i.e., Global System for Mobile Communications). As a result, speech that is recorded at one location can be transferred by means of a communication network 14, such as a mobile radio network 16 of FIG. 5a or a conventional telephone network 17 of FIG. 5b and converted into a text at some other location by a text generator 12. The conversion of speech data into a text at text generator 12 can be achieved in two ways:

1. the stored speech data can be converted and outputted as speech, and the speech data is listened to, for instance by a secretary, and converted by the secretary into a text;
2. the stored speech data can be converted automatically into a text by means of a speech recognition system.

Existing speech recognition systems that convert stored speech into a text by means of speech pattern comparisons with known speech patterns of words, can be used for this purpose. The encoded stored speech is used in this case only for correction purposes. The automatically generated text is compared with the previously encoded stored speech data that is replayed. An obviously incorrectly recognized word can thus be identified immediately.

An apparatus for speech recording that is in a card format, for use in an ensuing text generation, will now be described in conjunction with FIG. 2. The card format speech recording apparatus shown in FIG. 2 comprises acoustical input and output means M, L respectively. The acoustical input means M, for example, is a microphone and the acoustic output means L, for example, is a loudspeaker. Speech is fed via the acoustic input means M to an analog-to-digital/digital-to-analog converter AD/DA where it is digitized. The digitized speech is further processed in a digital signal processor DSP. The digital signal processor DSP has an internal memory MEM 1 for storing programs. A further memory MEM2 is also connected to the digital signal processor DSP. Other apparatus, also connected to the digital signal processor DSP, comprises an operator controlled device USE, which in turn, comprises control elements for selecting control functions, and a CARD having a card interface CARD I/O (also shown in FIG. 4b) for connection of the apparatus to a data processing terminal unit, such as a PC, or a speech processing system (not shown). The card interface, CARD I/O of FIG. 4b can for instance comprise a PCMCIA card interface. The control elements T of the operator device USE can for instance comprise a membrane keyboard or push buttons (shown in FIG. 4c).

Figures 4A, 4B:
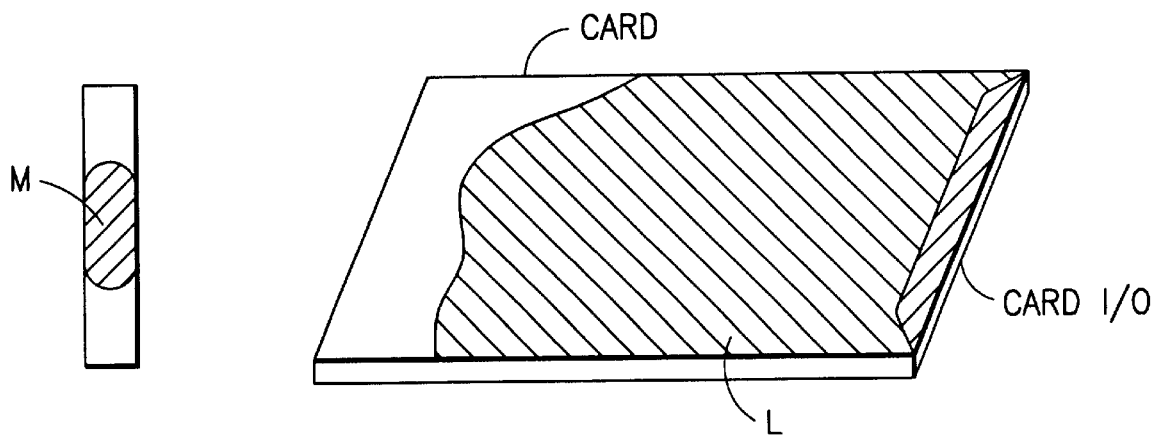
FIG. 4a shows a top strip of the card shown in FIG. 2.
FIG. 4b is a bottom view of the card shown in FIG. 2.

The apparatus in the form of a CARD is shown in FIG. 4b and has control functions of the kind known from prior art dictation machines. In order to output previously stored speech, there is an acoustic output means (L), in the form of a planar speaker that can be formed on the card as shown in FIG. 4b.

In one possible exemplary embodiment of the apparatus in a card format, the CARD of FIG. 4b may contain as the digital signal processor DSP a low-power DSP, for instance, and a 16 Mbit or 32 Mbit NAND EEPROM such as National Semiconductor part number NM29N16 mentioned above which can serve as the further memory MEM2. The data stored in the further memory MEM2 is encoded, dependent on a further processing or text generation, by PCM, ADPCM (i.e., Adaptive Differential Pulse Code Modulation), GSM or by 4.8 kbit/second code processing. The 4.8 KB/second code is a low-bit-rate code. A GSM code processing means coding with 13 KB/sec.

One possible embodiment of the apparatus in a card format will be described in detail below in conjunction with FIGS. 4a, 4b and 4c.

Figure 2:
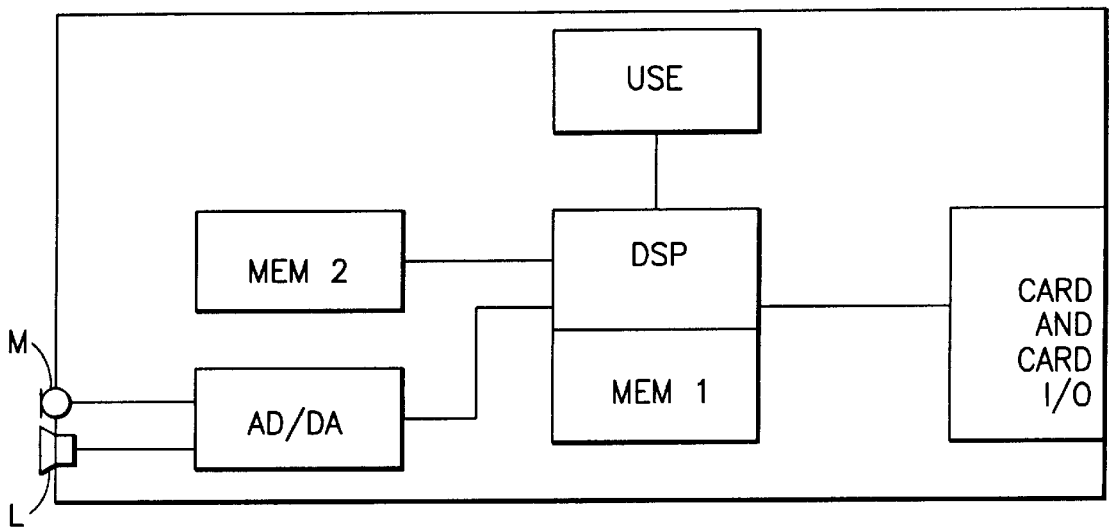
FIG. 2 is a block diagram of an apparatus in a card format according to the invention for recording speech.
Figure 4C:
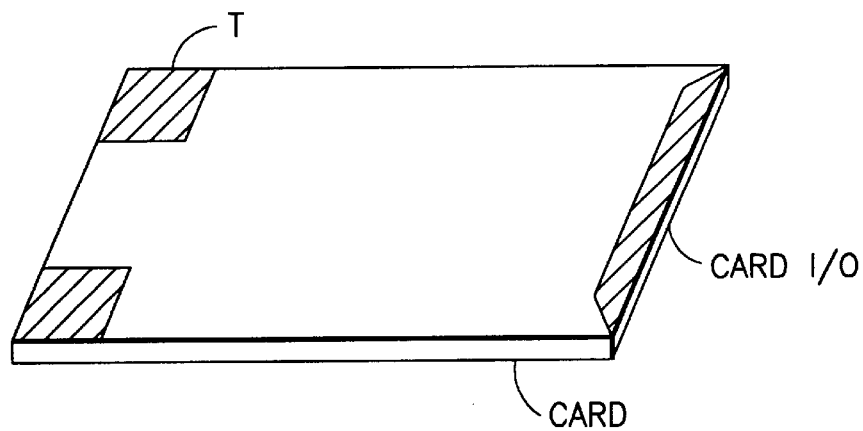
FIG. 4c is a top view of the card shown in FIG. 2.

FIG. 4c is a top view of CARD of FIG. 2 according to the invention. Located on a top surface of CARD are so-called pushbuttons, or a membrane keyboard and the control elements T of the pushbuttons or membrane keyboard. The card interface, CARD I/O, is located on the insertion end of CARD. For practical reasons, the microphone M could be placed in an upper strip on the CARD, as shown in FIG. 4a and located opposite to the insertion end (opposite to CARD I/O of CARD), which would make it practical to manipulate.

FIG. 4b shows a bottom view of CARD wherein the speaker L is a planar speaker, for instance. The arrangement shown in FIGS. 4a, 4b and 4c is one possible configuration of CARD that is very practical to manipulate.

Figures 5A, 5B:
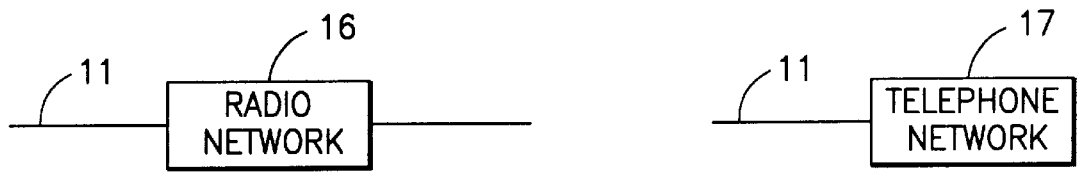
FIG. 5a is a block diagram showing the communication network 14 as a radio network.
FIG. 5b is a block diagram which shows the communication network 14 as a telephone network.

FIG. 5a shows that the communication network 14 of FIG. 1 can be a radio communication network. FIG. 5b shows that the communication network 14 of FIG. 1 can be a telephone network (e.g., a hard wired telephone network).

Figure 3:
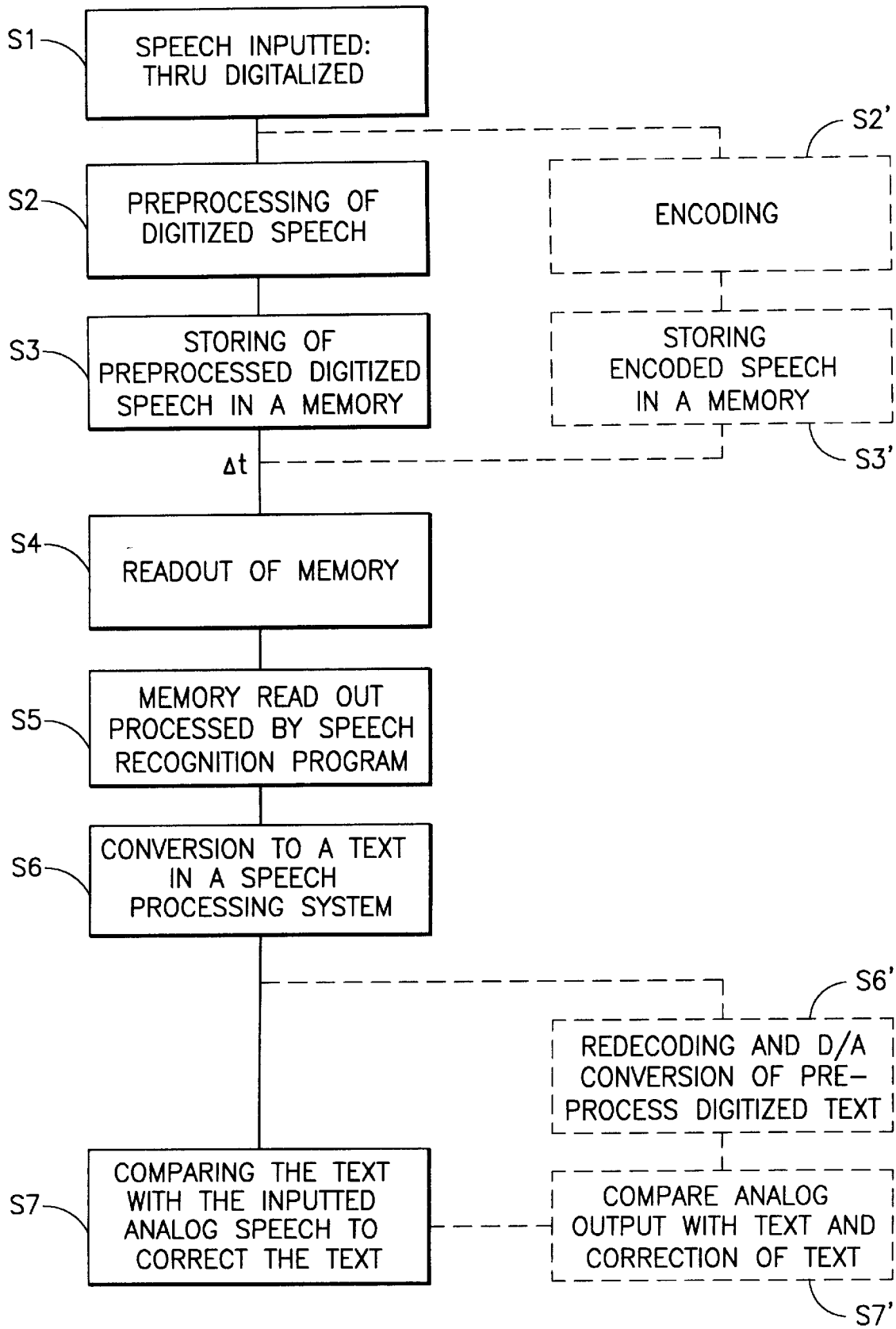
FIG. 3 is a flowchart of the method of the invention.

A method for speech recognition with subsequent text generation by means of a speech processing system will now be described in further detail in conjunction with the flow chart of FIG. 3. In the method, in a first step S1, speech is inputted to microphone M, and the inputted speech is digitized (in AD/DA). In step S2, preprocessing of the digitized speech by use of a feature extraction method is performed in VV. In step S3, the digitized, preprocessed speech from step S2 is stored in a memory (MEM).

At some subsequent time Δt, for instance, the digitized, preprocessed stored speech is read out of the memory MEM in step S4. In a next step S5, a digitized preprocessed speech which was read out of the memory MEM is fed to a speech recognition system having a speech recognition program. The speech processing system having the speech recognition program performs a pattern comparison with words stored in reference memories. The aforementioned speech processing system is well-known in the prior art (see the DESCRIPTION OF THE PRIOR ART hereinabove). In step S6, the inputted speech is converted into a text. Then in step S7 the digitized preprocessed speech is decoded and converted to analog speech for comparison with the text wherein the analog speech is compared to the text for use in correcting the text.

In addition, the speech inputted and digitized in the first step S1 can also be encoded in parallel to step S2 in a step S2'. To this end, a so-called low-bit-rate coder-decoder (CODER shown in FIG. 1) and operating at 4.8 kbits/sec, or a GSM, operating at 13 kbits/sec or a PCM or ADPCM, can be used. The encoded speech encoded in CODEC can be stored in a further step S3' which occurs in parallel to step S3. The speech encoded and stored in memory in Step S3' in this way provides a better possibility than step S3 for correction to the text in the event that correction is needed. The output data of step S3' is then processed in steps S4–S6 in the same manner as the speech in step S1-3 is processed in steps S4–S6. The speech converted into text in the sixth step S6 can be presented to a user in the form of a text file, and enables simple corrections to be made. The encoded speech can be redecoded and converted into analog speech in step S6'. In step S7' a direct comparison of the generated text and the analog speech is made. A user thus can make a direct comparison between a recognized word in the generated text and the words actually spoken. The dashed lines indicating steps S2', S3', S6' and S7' indicate that these steps are optional.

Various changes and modifications may be made, and features described in connection with any one of the embodiments may be used with any of the others, within the scope of the inventive concept.

What is claimed is:

1. An apparatus for recording speech for subsequent generation of a text, comprising:

acoustic input and output means (L,M) for inputting and outputting analog speech respectively;

an analog-to-digital/digital-to-analog converter (AD/DA) for converting the inputted analog speech to digitized speech and for converting the digitized speech to analog speech;

preprocessing means (VV) for preprocessing the digitized speech digitized by the converter (AD/DA) by extracting component characteristics from the digitized speech;

a digital memory means (MEM) for storing the digitized, preprocessed speech;

a controller (CON) for controlling execution of inputted operating functions by at least one of the preprocessing means (VV) and the digital memory means (MEM); and a data link (11) for transmitting the digitized, preprocessed speech stored in the digital memory means (MEM) via a communication network (14) to a remote text generator (12) for generating text corresponding to the inputted analog speech.

2. An apparatus as claimed in claim 1, further comprising:

a coder-decoder (CODEC) for coding the digitized speech received from the converter (AD/DA) before the digitized speech is stored in the digital memory (MEM).

3. An apparatus as claimed in claim 2, wherein the digital memory means (MEM) comprises one of a nonvolatile nonremovable EEPROM functioning as a random-access memory, and a removable PCMCIA card functioning as a random access memory.

4. An apparatus as claimed in claim 3, wherein the communication network (14) comprises one of a radio network (16) and a telecommunication network (17).

5. An apparatus as claimed in claim 1, wherein the digital memory means (MEM)comprises one of a nonvolatile non-removable EEPRON functioning as a random-access memory, and a removable PCMCIA card functioning as a random-access memory.

6. An apparatus as claimed in claim 5, wherein the communication network (14) comprises one of a radio network (16) and a telecommunication network (17).

7. The apparatus as claimed in claim 1, wherein the preprocessing means (VV) extracts spectral components from the digitized speech.

8. A method of recording speech for subsequent generation of a text using a speech-processing system, said method comprising:

digitizing an input analog speech;

preprocessing the digitized analog speech by extracting spectral component characteristics from the digitized analog speech for subsequent generation of a text by means of speech recognition processing;

storing the digitized, preprocessed analog speech in a digital memory;

transmitting the digitized, preprocessed analog speech from the digital memory to a remote text generator (12) by means of a data link (11) via a communication network (14); and converting the transmitted speech into text by means of a speech-processing system that includes a speech recognition processing program.

9. The method as claimed in claim 8, further comprising:

encoding and storing the digitized analog speech in parallel with the preprocessing and storing steps; and after the conversion of the digitized, preprocessed speech into the text, then decoding the encoded speech;

converting the encoded digitized speech into the input analog speech; and correcting the text by comparing the text generated by the speech processing system with the input analog speech.

10. The method according to claim 9, wherein the preprocessing step extracts spectral component characteristics from the digitized speech.

* * * * *